US006263467B1

(12) United States Patent
Hladik et al.

(10) Patent No.: US 6,263,467 B1
(45) Date of Patent: Jul. 17, 2001

(54) TURBO CODE DECODER WITH MODIFIED SYSTEMATIC SYMBOL TRANSITION PROBABILITIES

(75) Inventors: Stephen Michael Hladik, Albany; John Anderson Fergus Ross; Nick Andrew Van Stralen, both of Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/137,256

(22) Filed: Aug. 20, 2001

(51) Int. Cl.[7] .................... H03M 13/00

(52) U.S. Cl. .................... 714/755; 714/751

(58) Field of Search .................... 375/341, 500.23, 375/231, 142, 349, 233, 755, 786, 749, 751

(56) References Cited

U.S. PATENT DOCUMENTS

| | | | | |
|---|---|---|---|---|
| 5,406,570 | | 4/1995 | Berrou et al. | 714/792 |
| 5,446,747 | | 8/1995 | Berrou | 714/788 |
| 5,721,745 | | 2/1998 | Hladik et al. | 714/755 |
| 5,721,746 | | 2/1998 | Hladik et al. | 714/792 |
| 5,734,962 | | 3/1998 | Hladik et al. | 455/12.1 |
| 5,933,462 | * | 8/1999 | Viterbi et al. | 375/341 |
| 5,991,525 | * | 11/1999 | Shah et al. | 395/500.23 |
| 6,002,716 | * | 12/1999 | Meyer et al. | 375/231 |
| 6,044,111 | * | 3/2000 | Meyer et al. | 375/231 |
| 6,061,387 | * | 5/2000 | Yi | 375/142 |
| 6,064,703 | * | 5/2000 | Cusani et al. | 375/349 |
| 6,118,816 | * | 9/2000 | Meyer et al. | 375/233 |

OTHER PUBLICATIONS

"Illuminating the Structure of Code and Decoder of Parallel Concatenated Recursive Systematic (Turbo) Codes," Patrick Robertson, IEEE, 1994, pp. 1298–1303.

"Optimal Decoding of Linear Codes for Minimizing Symbol Error Rate," LR Bahl, J Cocke, F. Jelinek; J Raviv, IEEE Transactions on Information Theory, Mar. 1974, pp. 284–287.

"Near Shannon Limit–Correcting Coding and Decoding: Turbo–Codes (1)," Claude Berrou, Alain Glavieux; Punya Thitimajshima, IEEE, 1993, pp. 1064–1070.

* cited by examiner

*Primary Examiner*—Albert Decady
*Assistant Examiner*—David Ton
(74) *Attorney, Agent, or Firm*—Jill M. Breedlove; Douglas E. Stoner

(57) ABSTRACT

A feedback control for a turbo decoder controls the feedback between component decoders of the turbo decoder by substituting either a neutral value or a weighted value for the channel transition probabilities utilized by each component decoder during the iterative decoding process. A control switch selects either estimated channel transition probabilities, modifications of these values, or neutral values as the channel transition probabilities utilized by the next component decoder in the subsequent decoding iteration.

16 Claims, 7 Drawing Sheets

SOFT LIMITER FUNCTION WITH DEAD ZONE AT x = 1/2

$$f(x) = \begin{cases} C & ; o \le x \le a \\ m(x-a) + c & ; a < x < b \\ 1/2 & ; b \le x \le (1-b) \\ m(x-1+a) + (1-c) & ; (1-b) < x < (1-a) \\ 1-c & ; (1-a) \le x \le 1 \end{cases}$$

$$\text{where } m = \frac{(1/2) - c}{b-a}$$

TURBO CODE DECODER WITH MODIFIED SYSTEMATIC SYMBOL TRANSITION PROBABILITIES

BACKGROUND OF THE INVENTION

The present invention relates generally to error-correction coding and, more particularly, to parallel concatenated convolutional coding, i.e., turbo coding.

A new class of forward error control codes, referred to as turbo codes, offers significant coding gain for power limited communication channels. Typically, turbo codes are generated by using two recursive systematic encoders operating on different permutations of the same information bits. A subset of the code bits generated by each encoder is transmitted to maintain bandwidth efficiency. Turbo decoding involves an iterative algorithm in which probability estimates of the information bits that are derived for one of the code words are fed back to a probability estimator for the other code word. Each iteration of processing generally increases the reliability of the probability estimates. This process continues, alternately decoding the two code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory,* March 1974, pp. 284–287, is particularly useful as a component decoder in decoding parallel concatenated convolutional codes, i.e., turbo codes. The MAP algorithm is used in the turbo decoder to generate a posteriori probability estimates of the systematic bits in the code word. These probability estimates are used as a priori symbol probabilities for the second MAP decoder. Three fundamental terms in the MAP algorithm are: forward and backward state probability functions (the alpha and beta functions, respectively) and the a posteriori transition probabilities (the sigma function).

It is desirable to control and reduce feedback among component decoders in a MAP decoder in order to improve performance.

SUMMARY OF THE INVENTION

A feedback control for a turbo decoder controls the feedback between component decoders of the turbo decoder by substituting either a neutral value or a weighted value for the channel transition probabilities utilized by each component decoder during an iterative decoding process. A control switch selects either estimated channel transition probabilities, modifications of these values, or neutral values as the channel transition probabilities utilized by the next component decoder in the subsequent decoding iteration.

DETAILED DESCRIPTION OF THE INVENTION

Summary of the MAP Decoding Algorithm

The maximum a posteriori (MAP) algorithm for decoding linear codes was published by Bahl, Cocke, Jelinek, and Raviv, as cited hereinabove. Basically, this algorithm calculates the a posteriori probability of each state in a trellis corresponding to a received code word conditioned on the entire received code word. A variation of this algorithm calculates the a posteriori probability of each state transition in a trellis corresponding to a received code word conditioned on the received channel information. Since this variation is of particular interest when decoding recursive systematic convolutional codes, which are typically utilized in turbo coding, the description of the invention will be built around this form of the algorithm. However, the invention also applies to the version of the MAP algorithm that calculates a posteriori state probabilities in a straightforward manner.

Figure 1:
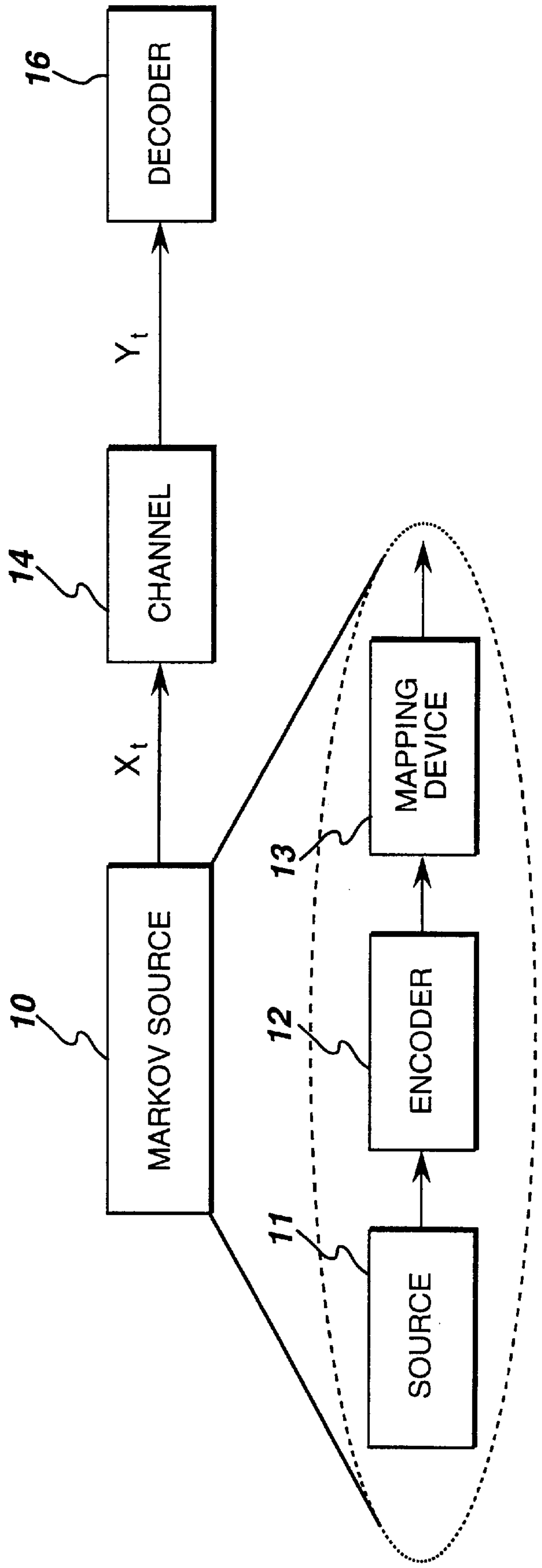
FIG. 1 is a block diagram of a simple communications system comprising a Markov source, a memoryless channel and decoder.

Consider the simple communication system block diagram of FIG. 1 for the purpose of describing the MAP algorithm. The source 10 is a discrete-time, finite-state Markov process, shown as comprising a source 11, an encoder 12, and a mapping device 13. As shown, the source's output at time t is $X_t$ and the corresponding channel 14 output is $Y_t$, which is provided as the input to a decoder 16. The following definitions are also needed to describe the MAP algorithm. Let M=the number of distinct states of the Markov source;

m=the index of the Markov source's states $\{0,1, \ldots ,M-1\}$;

$S_t$=state of the Markov source at time t;

$S_t^u=S_t, S_{t+1}, S_u$, the state sequence of the Markov source from time t to time u;

$X_t^u=X_t, X_{t+1}, \ldots X_u$, the output sequence of the Markov source from time t to time u;

$Y_t^u=Y_t, Y_{t+1}, \ldots Y_u$, the output sequence of the channel from time t to time u, and L=the length of the source's output sequence.

Furthermore, it is assumed that the Markov source's initial state $S_0=0$ and its final state $S_L=0$.

The channel is noisy and memoryless so that a sequence of the source's output symbols $X_t^u$ is transformed into a sequence of channel outputs $Y_t^u$ according to the following channel transition probabilities.

$$Pr\{Y_t^u|X_t^u\}=Pr\{Y_t|X_t\}\Pr\{Y_{t+1}|X_{t+1}\} \ldots \Pr\{Y_u|X_u\} \tag{1}$$

The decoder examines the received channel output sequence and estimates the a posteriori probabilities of the Markov source's states or state transitions. The state a posteriori probabilities $\Pr\{S_t=m|Y_1^L\}$ can be written as $$Pr\{S_t=m|Y_1^L\}=Pr\{S_t=m; Y_1^L\}/Pr\{Y_1^L\} \tag{2}$$

using the definition of conditional probability. Our notation is as follows: Pr{A|B} means the conditional probability of event A given event B, and Pr{A;B} means the joint probability of events A and B. Similarly, the source's state transition a posteriori probabilities can be written as $$Pr\{S_{t-1}=m'; S_t=m|Y_1^L\}=Pr\{S_{t-1}=m'; S_t=m; Y_1^L\}/Pr\{Y_1^L\}. \tag{3}$$

It turns out that it is easier to derive an algorithm to calculate the joint probabilities on the right-hand sides of equations (2) and (3). The desired conditional probabilities can then be obtained by simply dividing these joint probabilities by the constant $Pr\{Y_1^L\}$. To clarify the derivation, Bahl et al. defined the following probability functions.

$$\alpha_t(m)=Pr\{S_t=m;\ Y_1^t\} \tag{4}$$

$$\beta_t(m)=Pr\{Y_{t+1}^L|S_t=m\} \tag{5}$$

$$\gamma_t(m',m)=Pr\{S_t=m;\ Y_t|S_{t-1}=m'\} \tag{6}$$

It can be shown that $$Pr\{S_t=m;\ Y_1^L\}=\alpha_t(m)\beta_t(m) \text{ and} \tag{7}$$

$$Pr\{S_{t-1}=m';\ S_t=m;\ Y_1^L\}=\alpha_{t-1}(m')\gamma_t(m',m)\beta_t(m) \tag{8}$$

so all that remains is to calculate the values of $\alpha_t(m)\gamma_t(m',m)$ and $\beta_t(m)$ for all values of m and t. It can be shown that for t=1,2, . . . ,L, $\alpha_t(m)$ can be calculated recursively as follows.

$$\alpha_t(m)=\sum_{m'=0}^{M-1}\alpha_{t-1}(m')\gamma_t(m',m) \tag{9}$$

For t=0, the boundary conditions are $\alpha_t(0)=1$ and $\alpha_0(m)=0$ for all m≠0. Similarly, $\beta_t(m)$ can be calculated recursively for t=1,2, . . . ,L−1.

$$\beta_t(m)=\sum_{m'=0}^{M-1}\beta_{t+1}(m')\gamma_{t+1}(m,m') \tag{10}$$

For t=L, the boundary conditions are $\beta_L(0)=1$ and $\beta_L(m)=0$ for all m≠0. In the calculation of $\gamma_t$, this quantity may be expanded as $$\gamma_t(m',m)=\sum_X Pr\{S_t=m\mid S_{t-1}=m'\}\,Pr\{X_t=X\mid S_t=m;\ S_{t-1}=m'\}Pr\{Y_t\mid X\} \tag{11}$$

For the cases of interest to us, the source's mapping of state transitions to output symbols is deterministic; i.e. there is only one possible output symbol X for each state transition, so that $Pr\{X_t|S_t=m;\ S_{t-1}=m'\}=1$ and $\gamma_t(m',m)$ can be written as $$\gamma_t(m',m)=Pr\{S_t=m|S_{t-1}=m'\}Pr\{Y_t|X\}. \tag{12}$$

The calculation of $Pr\{S_{t-1}=m';\ S_t=m;\ Y_1^L\}$ using the algorithm of Bahl et al. can be summarized as follows.

1. $\alpha_0(0)=1$ and $\alpha_0(m)=0$ for all m≠0. $\beta_L(0)=1$ and $\beta_L(m)=0$ for all m≠0.
2. As soon as $Y_t$ is received, the decoder computes $\gamma_t(m',m)$ using equation (12) and $\alpha_t(m)$ using equation (9). The calculated values of $\alpha_t(m)$ are stored for all t and m. The calculated values of $\gamma_t(m',m)$ are stored for all t and all transitions (m',m) or calculated as needed.
3. After the complete sequence of channel outputs $Y_1^L$ is received, the decoder recursively computes $\beta_t(m)$ using equation (10). When all of the $\beta_t(m)$ have been computed, they can be multiplied by the appropriate $\alpha_{t-1}(m')$ and $\gamma_t(m',m)$ to obtain $Pr\{S_{t-1}=m';S_t=m;\ Y_1^L\}$ as in equation (8).

When decoding trellis codes, the Markov source of FIG. 1 can be modeled as comprising a source of information bits, an encoder for the error correcting trellis code, and a mapping device that converts the encoder's output into symbols $X_t$, which are transmitted over the channel.

The term $Pr\{S_t=m|S_{t-1}=m'\}$, the encoder's conditional state probability, in equation (12) is calculated as $$Pr\{S_t=m\mid S_{t-1}=m'\}=\prod_{i=(t-1)k+1}^{tk}Pr\{d_i=a_i(m',m)\} \tag{13}$$

for an (n,k,v) code where $Pr\{d_i=a_i(m',m)\}$ is the a priori probability that $d_i=a_i(m',m)$ and $a_i(m',m)$ is the $i^{th}$ bit of the sequence a(m',m) of k bits that drives the encoder from state m' to state m. This equation holds when the code's trellis does not have parallel branches. (If the code's trellis does have parallel branches, then $Pr\{S_t=m|S_{t-1}=m'\}$ is calculated as the sum of products of bit a priori probabilities in which the sum is over all of the sequences of source bits a(m',m) that drive the encoder from state m' to state m.)

In the decoder, we are interested in event likelihood ratios; specifically, we are interested in $Pr\{d_\tau=1|Y_1^L\}/Pr\{d_\tau=0|Y_1^L\}$, where $Pr\{d_\tau=i|Y_1^L\}$ represents the a posteriori probability that data bit $d_\tau$ from the source is equal to i∈ (0,1). Here, $$Pr\{d_\tau=0\mid Y_1^L\}=\sum_{(m',m)\in A_t(\tau)}Pr\{S_{t-1}=m';\ S_t=m\mid Y_1^L\}=\frac{\sum_{(m',m)\in A_t(\tau)}Pr\{S_{t-1}=m';\ S_t=m;\ Y_1^L\}}{Pr\{Y_1^L\}} \tag{14}$$

In the equation above $A_t(\tau)$ is the set of all state transitions (m',m) in the encoder which terminate at time t due to an information bit $d_\tau=0$. Recall that in general there are k source bits encoded into each n-bit encoder output symbol so that $d_\tau$ for indices τ=(t−1)k+1, (t−1)k+2, . . . , tk are associated with the state transition $S_{t-1}$ to $S_t$. Also, $$Pr\{d_\tau=1\mid Y_1^L\}=\sum_{(m',m)\in B_t(\tau)}Pr\{S_{t-1}=m';\ S_t=m\mid Y_1^L\}=\frac{\sum_{(m',m)\in B_t(\tau)}Pr\{S_{t-1}=m';\ S_t=m;\ Y_1^L\}}{Pr\{Y_1^L\}} \tag{15}$$

In the equation above $B_t(\tau)$ is the set of all state transitions (m',m) in the encoder which terminate at trellis level t due to an information bit $d_\tau=1$. Since we are working with the likelihood ratio $Pr\{d_\tau=1|Y_1^L\}/Pr\{d_\tau=0|Y_1^L\}$, it is not necessary to calculate $Pr\{S_{t-1}=m';S_t=m|Y_1^L\}$; we may use $Pr\{S_{t-1}=m';S_t=m;\ Y_1^L\}$ directly since $Pr\{Y_1^L\}$ is common to the numerator and denominator. Therefore, the desired likelihood ratio from the decoder is $$\lambda(d_\tau)=\frac{Pr\{d_\tau=1\mid Y_1^L\}}{Pr\{d_\tau=0\mid Y_1^L\}}=\frac{\sum_{(m',m)\in B_t(\tau)}Pr\{S_{t-1}=m';\ S_t=m;\ Y_1^L\}}{\sum_{(m',m)\in A_t(\tau)}Pr\{S_{t-1}=m';\ S_t=m;\ Y_1^L\}} \tag{16}$$

Since the joint probability $Pr\{S_{t-1}=m';\ S_t=m;\ Y_1^L\}$ is used often herein, the following notation from Bahl et al. is introduced for brevity.

$$\sigma_t(m',m)=Pr\{S_{t-1}=m';\ S_t=m;\ Y_1^L\}=\alpha_{t-1}(m')\gamma_t(m',m)\beta_t(m \tag{17}$$

When the encoder's input symbols are binary, i.e. k=1, equations (13) through (16) can be simplified since τ=t in this case. The simplified equations are presented below.

$$Pr\{S_t=m|S_{t-1}=m'\}=P\{d_t=a(m',m)\},\text{ where} \tag{18}$$

a(m',m)=the bit value that drives the encoder from state m' to state m.

$$\begin{aligned}Pr\{d_t=0\mid Y_1^L\} &= \sum_{(m',m)\in A_t} Pr\{S_{t-1}=m';S_t=m\mid Y_1^L\} \\ &= \frac{\sum_{(m',m)\in A_t} Pr\{S_{t-1}=m';S_t=m;Y_1^L\}}{Pr\{Y_1^L\}} \\ &= \frac{\sum_{(m',m)\in A_t}\sigma_t(m',m)}{Pr\{Y_1^L\}},\text{ where}\end{aligned} \tag{19}$$

$A_t$=the set of all state transitions (m',m) which terminate at level t in the encoder due to an information bit $d_t$=0.

$$\begin{aligned}Pr\{d_t=1\mid Y_1^L\} &= \sum_{(m',m)\in B_t} Pr\{S_{t-1}=m';S_t=m\mid Y_1^L\} \\ &= \frac{\sum_{(m',m)\in B_t} \{S_{t-1}=m';S_t=m;Y_1^L\}}{Pr\{Y_1^L\}} \\ &= \frac{\sum_{(m',m)\in B_t}\sigma_t(m',m)}{Pr\{Y_1^L\}},\text{ where}\end{aligned} \tag{20}$$

$B_t$=the set of all state transitions (m',m) which terminate at trellis level t in the encoder due to an information bit $d_t$=1.

$$\begin{aligned}\lambda(d_t) &= \frac{Pr\{d_t=1\mid Y_1^L\}}{Pr\{d_t=0\mid Y_1^L\}} \\ &= \frac{\sum_{(m',m)\in B_t} Pr\{S_{t-1}=m';S_t=m;Y_1^L\}}{\sum_{(m',m)\in A_t(\tau)} Pr\{S_{t-1}=m';S_t=m;Y_1^L\}} \\ &= \frac{\sum_{(m',m)\in B_t}\sigma_t(m',m)}{\sum_{(m',m)\in A_t}\sigma_t(m',m)}.\end{aligned} \tag{21}$$

Description of the Log-MAP Decoder

The MAP decoder algorithm presented earlier requires a large number of multiplications. For some implementations wherein a large number of multiplications may be impractical, e.g., integrated circuit implementations, a logarithmic version of the MAP algorithm has been derived that eliminates all multiplication operations. The log-MAP algorithm primarily uses additions, table look-ups, and some simple logic functions. In an integrated circuit implementation of a decoder for trellis codes, the replacement of multiplications with additions enables large savings in gate count (die area) and significant increases in decoding speed. The following is a summary of the basic log-MAP algorithm.

Equations (7) through (10) become $$\ln Pr\{S_t=m;\ Y_1^L\}=\ln \alpha_t(m)+\ln \beta_t(m), \tag{22}$$

$$\ln Pr\{S_{t-1}=m';\ S_t=m;\ Y_1^L\}=\ln \sigma_t(m',m)=\ln \alpha_{t-1}(m')+\ln \gamma_t(m',m)+\ln \beta_t(m), \tag{23}$$

$$\ln\alpha_t(m)=\ln\sum_{m'=0}^{M-1}\exp(\ln\alpha_{t-1}(m')+\ln\gamma_t(m',m)),\text{ and} \tag{24}$$

$$\ln\beta_t(m)=\ln\sum_{m'=0}^{M-1}\exp(\ln\beta_{t+1}(m')+\ln\gamma_{t+1}(m,m')). \tag{25}$$

Equations (24) and (25) are derived from equations (9) and (10), respectively, by applying the identity $$a\cdot b=\exp(\ln[a\cdot b])=\exp(\ln a+\ln b)$$

to the product terms. For example, equation (24) is derived as follows:

$$\begin{aligned}\ln\alpha_t(m) &= \ln\sum_{m'=0}^{M-1}\alpha_{t-1}(m')\gamma_t(m',m) \\ &= \ln\sum_{m'=0}^{M-1}\exp(\ln[\alpha_{t-1}(m')\gamma_t(m',m)]) \\ &= \ln\sum_{m'=0}^{M-1}\exp(\ln\alpha_{t-1}(m')+\ln\gamma_t(m',m)).\end{aligned}$$

The boundary conditions are now ln $\alpha_0(0)$=0 and ln $\alpha_0(m)=-\infty$ for all m≠0. Similarly, ln $\beta_L(0)$=0 and ln $\beta_L(m)=-\infty$ for all m≠0. In a practical implementation, a large negative number is substituted for −∞.

The sum of exponential terms can be computed by applying the following identity.

$$\ln[\exp(a)+\exp(b)]=\max(a,b)+\ln[1+\exp(-|a-b|)] \tag{26}$$

Computational complexity can be significantly reduced by storing a table of values for the function ln[1+exp(−|a−b|)] and applying equation (26).

Experimentation has shown that 8 or 16 values of this function provide sufficient resolution to prevent performance degradation.

Equation (12) becomes $$\ln \gamma_t(m',m)=\ln Pr\{S_t=m|S_{t-1}=m'\}+\ln Pr\{Y_t|X\}. \tag{27}$$

Preferred Embodiments of the Invention

Turbo codes involve a parallel concatenation of two or more systematic codes. Decoding turbo code words is an iterative operation such that the work in decoding one component code word is used as a priori information for decoding another component code word. Iterations proceed a finite number of times with the passing of information between decoders comprising feedback in the decoding process. In accordance with preferred embodiments of the present invention, this feedback is controlled to improve decoder performance, e.g., by decreasing the probability of error in the decoded bits.

As set forth in the summary hereinabove, some of the fundamental terms in a MAP decoding algorithm are forward and backward state probabilities, commonly known as the alpha and beta functions, and a posteriori state transition probabilities, commonly known as the sigma functions. Calculations of these probabilities (i.e., the alpha, beta and sigma functions) require symbol transition probabilities, i.e., the gamma functions. From Bahl, Cocke, Jelinek, and Raviv in "Optimal Decoding of Linear Codes for Minimizing Symbol Error Rate", cited hereinabove, $$\gamma_t(m', m) = \sum_{Xt} P_t(m \mid m') q_t(X \mid m', m) R(Y_t \mid X_t) \quad (28)$$

where t is the symbol index and $$R(Y_t \mid X_t) = \prod_{j=1}^{J} R(Y_{tj} \mid X_{tj}) \quad (29)$$

where J is the number of bits comprising an encoder output symbol, $X_{tj}$ is the $j^{th}$ bit of symbol $X_t$ and $Y_{tj}$ is the $j^{th}$ channel output for received symbol $Y_t$, assuming binary signaling.

In a recursive systematic code, a single transition (m', m) determines a specific channel symbol $X_t$ so that the summation in equation (28) is eliminated and the function $q_t(X_t|m',m)$ is identically equal to one. Also, for a (2, 1) code, the channel transition probabilities are computed as the product of two one-dimensional transition probabilities for the information and parity bits; that is, $$R(X_t|Y_t)=R(Y_{ti}|X_{ti})R(Y_{tp}|X_{tp}). \quad (30)$$

where $X_{ti}$ is the transmitted symbol corresponding to the information bit at time t, $X_{tp}$ is the parity symbol corresponding to the parity bit generated at time t, and $Y_{ti}$ and $Y_{tp}$ are the channel outputs in response to $X_{ti}$ and $X_{tp}$, respectively.

Furthermore, in the turbo decoding procedure, the conditional state probabilities are determined by the a priori bit probabilities as follows:

$$P_t(m|m')=AP_t(0) \text{ if } X_{ti}|m,m'=0 \quad (31)$$

$$P_t(m|m')=AP_t(1) \text{ if } X_{ti}|m,m'=1 \quad (32)$$

where $AP_t(0)$ and $AP_t(1)$ are the a priori probabilities that the information bit at time t is 0 and 1, respectively, so that $$\gamma_t(m',m)=AP_t(0)R(Y_{ti}|0)R(Y_{tp}|X_{tp}) \text{ if } X_{ti}|m,m'=0 \quad (33)$$

and $$\gamma_t(m',m)=AP_t(1)R(Y_{ti}|1)R(Y_{tp}|X_{tp}) \text{ if } X_{ti}|m,m'=1 \quad (34).$$

The output of a MAP component decoder is an a posteriori probability estimate of the systematic symbols, denoted herein as $APP_t(0)$ and $APP_t(1)$ for $X_{ti}=0$ and $X_{ti}=1$, respectively. These a posteriori estimates are used as the a priori probabilities $AP_t(0)$ and $AP_t(1)$ for decoding another component code word. The probability estimates are initialized to $AP_t(0)=AP_t(1)=0.5$, or the equivalent neutral value if working with the logarithm based algorithm, after which the component decoders use the output APP's of the other component decoders as input AP's.

The gamma values from equation (12) are used in three calculations in the MAP algorithm, i.e., in the recursions that generate the alpha and beta state probabilities, and in the sigma calculations. The estimated channel transition probabilities are modified in these calculations in order to control feedback and improve performance in accordance with preferred embodiments of the present invention.

For one preferred embodiment comprising a linear MAP algorithm, the estimated channel transition probabilities for the received symbols corresponding to systematic bits initially utilized by the first decoder in its sigma (a posteriori state transition probability) calculations (for the first decoding iteration) are $R(Y_{ti}|0)=R(Y_{tj}|1)=0.5$. For subsequent decoding iterations of component code words comprising the turbo code word, excluding the last iteration, a modified channel transition probability is calculated for each received symbol corresponding to a systematic bit for use in the sigma probability calculations, wherein the modified value is a function of the iteration index. On the last decoding iteration, the unmodified channel transition probability is used.

Figure 2:
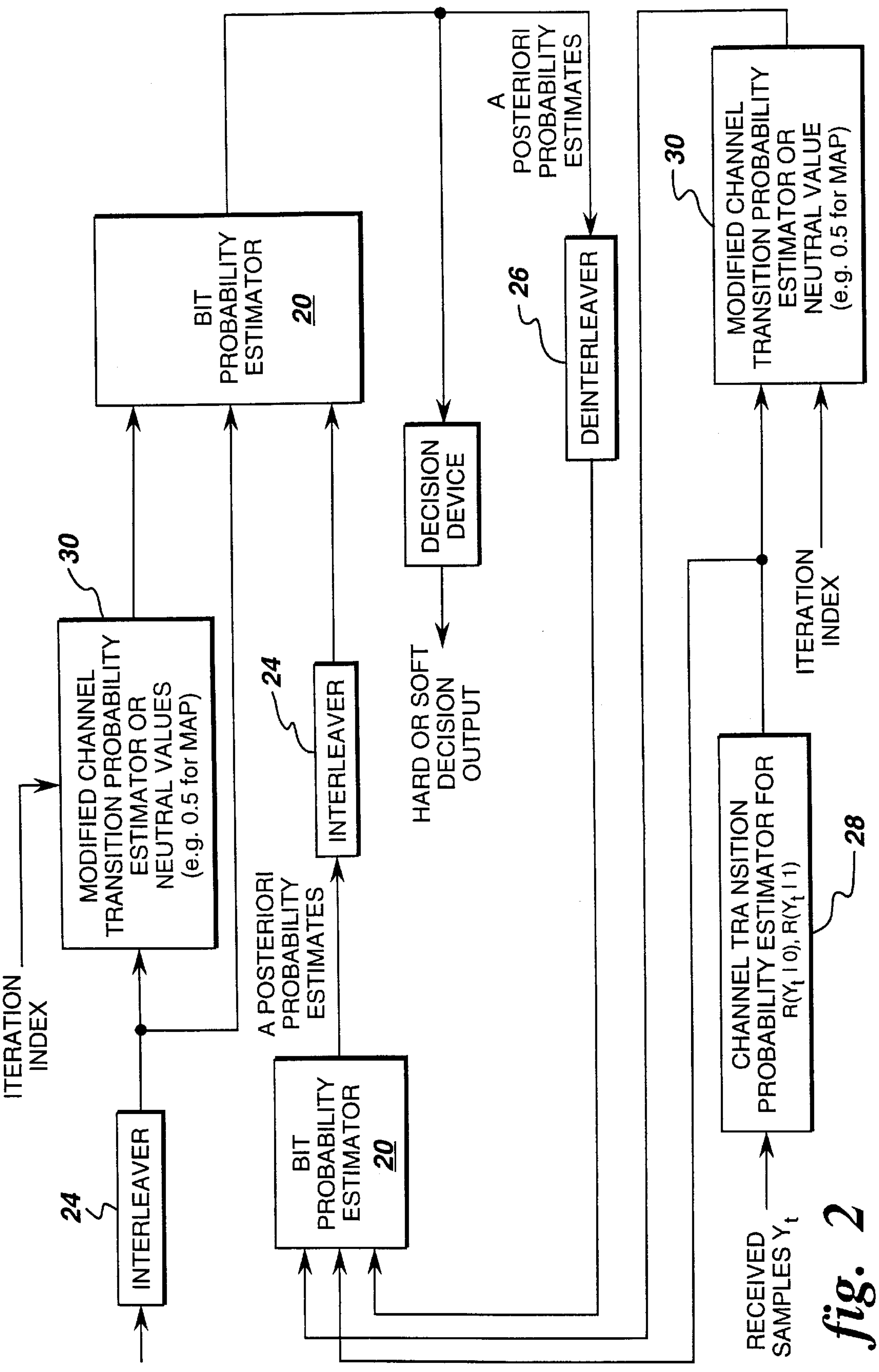
FIG. 2 is a block diagram of a turbo decoder in accordance with preferred embodiments of the present invention.

As shown in FIG. 2, blocks 20 represent bit probability estimators for the first and second component decoders, respectively. Associated turbo decoder interleavers and deinterleavers are represented by the numerals 24 and 26, respectively, the received samples $Y_t$ are provided to a channel transition probability estimator for $R(Y_t|0)$ and $R(Y_t|1)$, represented by the numeral 28. The channel transition probability estimates and the iteration index are provided as inputs to a modified channel transition probability estimator 30. The outputs of the channel transition probability estimator 28 and the modified channel transition probability estimator 30 are provided as inputs to the bit probability estimator 20 along with the a posteriori estimates via deinterleaver 26 or interleaver 24, as appropriate, as shown in FIG. 2.

Figure 3:
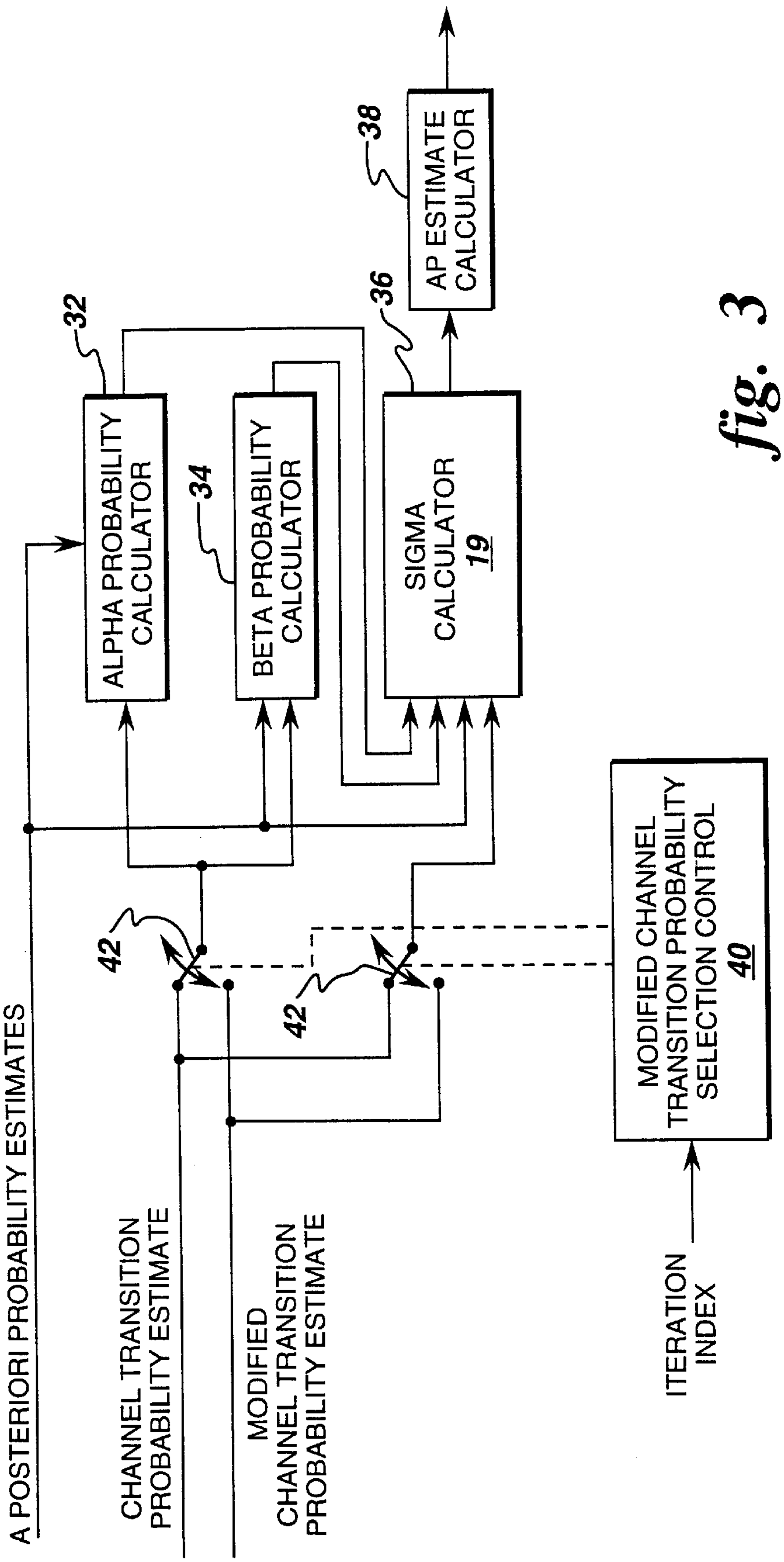
FIG. 3 is a block diagram of the bit probability estimator of FIG. 2.

FIG. 3 illustrates the bit probability estimator 20 of the illustrated embodiment of FIG. 2 in more detail. As shown, the bit probability estimator 20 comprises an alpha probability calculator 32, a beta probability calculator 34, a sigma calculator 36, and an AP estimate calculator 38. A modified channel transition probability selection control 40 selects, through switches 42, either the channel transition probability estimate or a modified channel transition probability estimate for the alpha, beta and sigma calculations. The selection of channel transition probability estimates or modified estimates for the alpha and beta calculations is independent of the selection of values for the sigma calculations.

In one preferred embodiment, full, i.e., unmodified, channel transition probability information is used for all alpha and beta calculations, and neutral channel transition probability values are switched in for all sigma calculations, except for the final iteration for which the feedback control switch is switched back to full channel transition probability information. Feedback is reduced most significantly when neutral values are inserted.

A compromise between full feedback and the neutral value is provided by a modified channel transition probability value. For the apparatus shown in FIG. 6, a simple modified received symbol value calculation useful in the linear MAP algorithm for the case of binary unipolar signaling with an average received signal amplitude of 0.5 is as follows:

$$Y'_{ti} = \frac{Y_{ti} \times N + K \times 0.5}{N + K} \quad (35a)$$

where K is a constant, and N is the iteration number.

It will be obvious to those with ordinary skill in the art that the modification rule of equation (35a) can be easily adapted to binary signaling in general. For example, an equivalent modification rule for binary antipodal signaling is $$Y'_{ti} = \frac{Y_{ti} \times N}{N + K}. \quad (35b)$$

Figure 4:
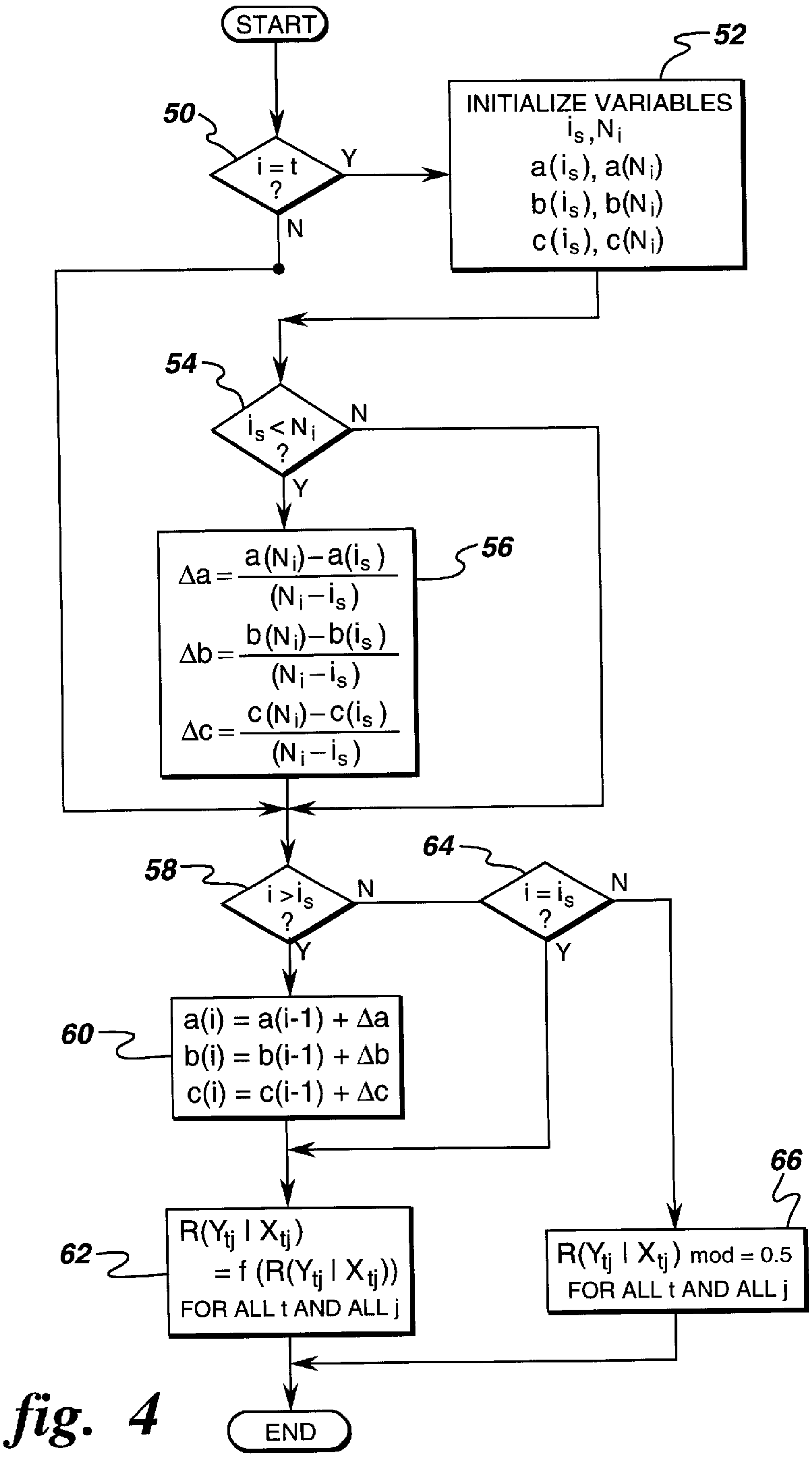
FIG. 4 is a flow chart illustrating modification of channel transition probability estimates in accordance with preferred embodiments of the present invention.
Figure 5:
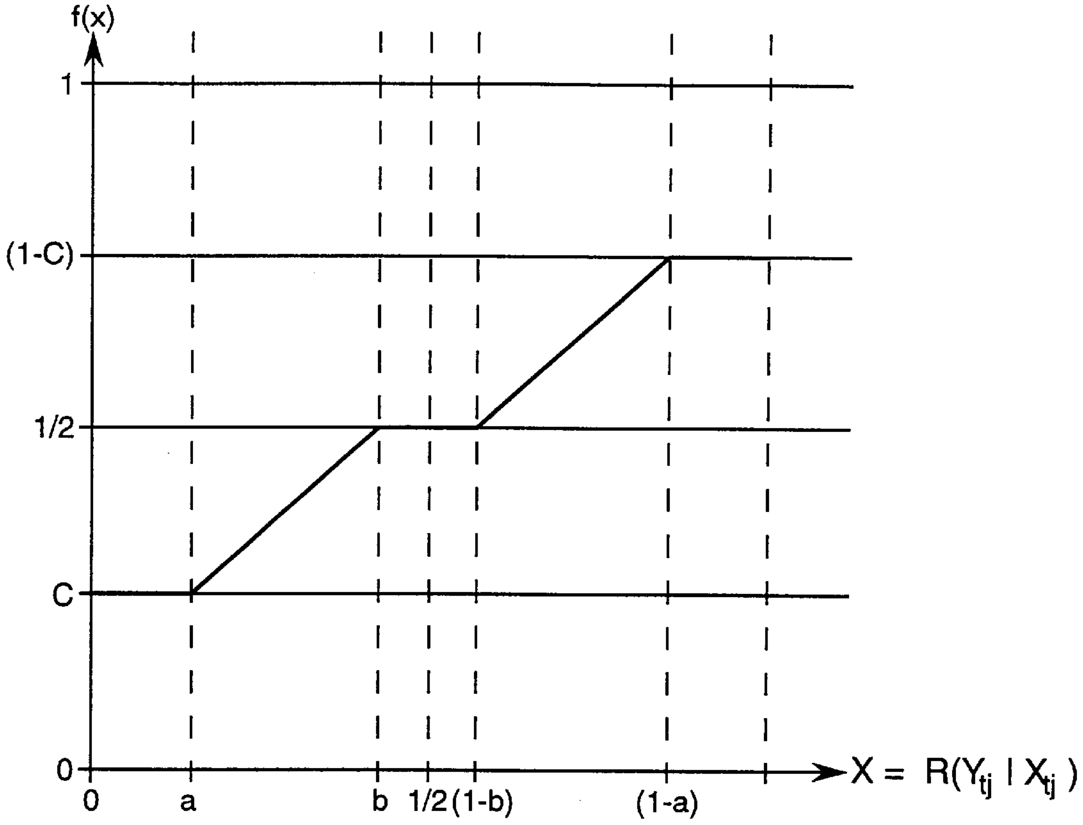
FIG. 5 graphically illustrates a soft limiter with a dead zone at x=½.

Another modified channel transition probability estimate useful in either the linear MAP algorithm or the log-MAP algorithm that is suitable to implement another preferred embodiment of FIG. 2 is calculated as a function of the decoding iteration count, as illustrated in the flow chart of FIG. 4. The variables for this procedure are set forth as follows: i represents the iteration count; $N_i$ represents the number of decoding iterations to be used; and $i_s$ represents the starting iteration index for using a function of the estimated channel transition probabilities, rather than neutral values, in the $\gamma_t(m',m)$ terms for state transition probability calculations $\sigma_t(m',m)$ or in the $\gamma_t(m',m)$ terms utilized in the forward and backward state probability calculations, $\alpha_t(m)$ and $\beta_t(m)$, respectively. Then, for iteration indices $i_s$, $i_s+1, \ldots, N_i$, the modified channel transition probability estimates are functions of the estimated channel transition probability estimates and iteration index. An exemplary type of modified channel transition probability estimate calculation is represented graphically in FIG. 5 as a modified soft limiter function $f$. In particular, the soft limiter function $f$ has been modified to allow a dead zone in the vicinity of 0.5 when b, a parameter of the function $f$, is not equal to 0.5. In accordance with preferred embodiments of the present invention, parameters a, b and c of the function f are functions of the iteration index in order to allow more (or, alternatively, less) feedback between component decoders as decoding proceeds.

The flow chart of FIG. 4 illustrates how the parameters, and hence the function $f$, change with iteration index. Specifically, the process illustrated in FIG. 4 represents one preferred embodiment of modified channel transition probability estimator (block 30) of FIG. 2. The parameter update and channel transition probability estimate modification process are summarized in the description that follows.

In decision block 50, a test is made to determine whether it is the first iteration, i.e., whether i=1. If so, the variables $i_s$ $N_i$, $a(i_s)$, $a(N_i)$, $b(i_s)$, $b(N_i)$, $c(i_s)$, and $c(N_i)$ are initialized in block 52. In block 54, a decision is made as to whether the starting iteration index (for calculating modified channel transition probabilities using the function $f$) is less than the number of decoding iterations. If so, then $\Delta a$, $\Delta b$, and $\Delta c$ are calculated in block 56 as follows:

$$\Delta a = \frac{a(N_i) - a(i_s)}{N_i - i_s} \tag{36}$$

$$\Delta b = \frac{b(N_i) - b(i_s)}{N_i - i_s} \tag{37}$$

$$\Delta c = \frac{c(N_i) - c(i_s)}{N_i - i_s} \tag{38}$$

If $i>i_s$, as determined in block 58, then the parameters a, b and c are updated in block 60 before the modified channel transition probabilities are calculated in block 62. If $i=i_s$, as determined in block 64, then the process bypasses block 60 and proceeds directly to block 62. If $i<i_s$, then the channel transition probability estimate is set equal to ½ or another neutral value, which is suitable for the application of interest, in block 66 for all t and all j.

In one preferred embodiment, full channel transition probability information is used for all alpha and beta calculations, and modified channel transition probability values, calculated as a function of the iteration count, are switched in for all sigma calculations, except for the final iteration for which the control switch is switched back to provide full (i.e., unmodified) channel transition probability information.

Figure 6:
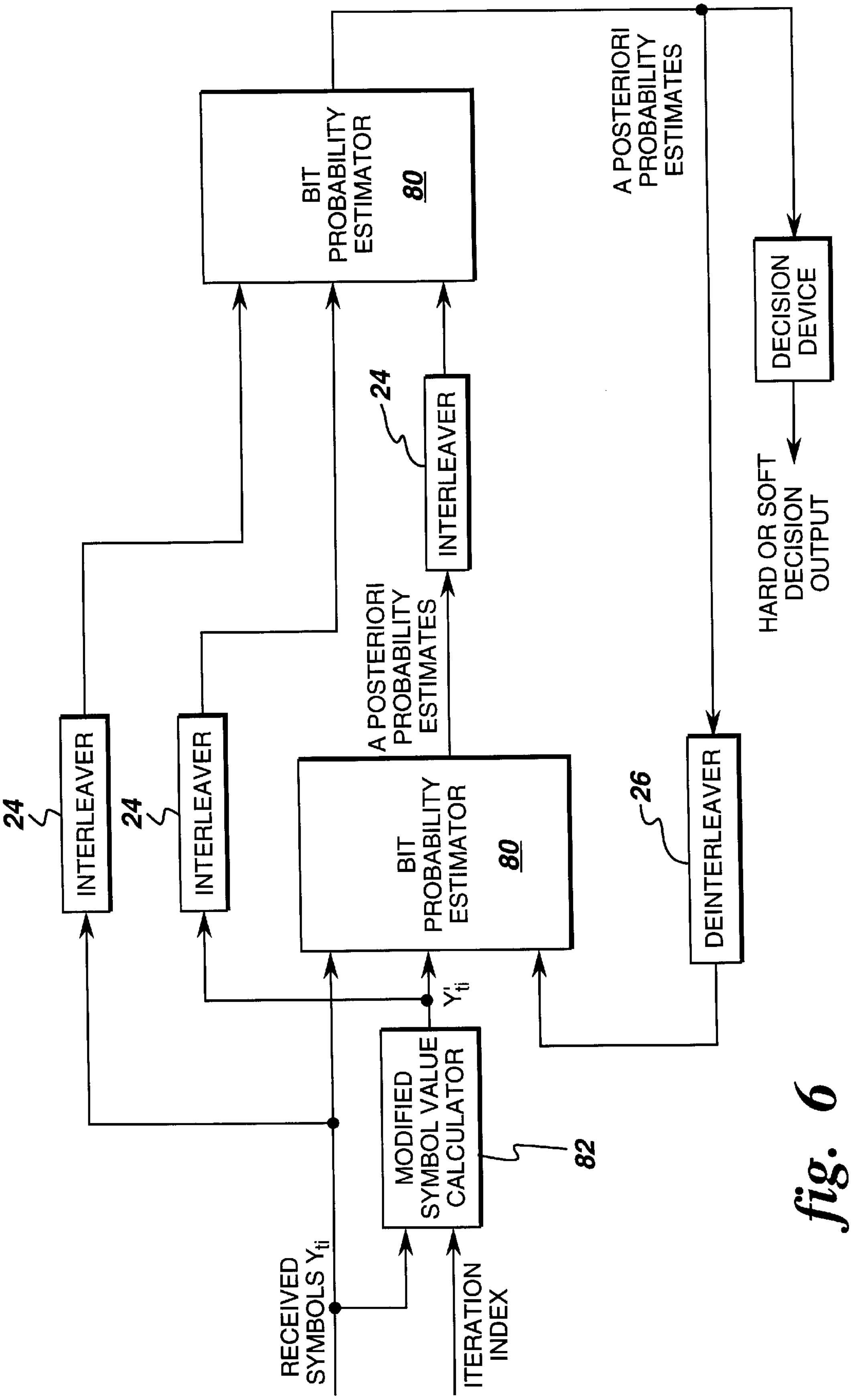
FIG. 6 is a block diagram of a turbo decoder in accordance with alternative embodiments of the present invention.

FIG. 6 illustrates an alternative embodiment of a turbo decoder of the present invention. As shown, the received symbols and iteration index are provided as inputs to a modified symbol value calculator 82. The output of the modified symbol value calculator and the received symbols are provided to a bit probability estimator 80 along with the a posteriori probability estimates via deinterleaver 26 or interleaver 24, as appropriate. In this embodiment, the channel transition probability modifications are generated via a modification of the received symbol values.

Figure 7:
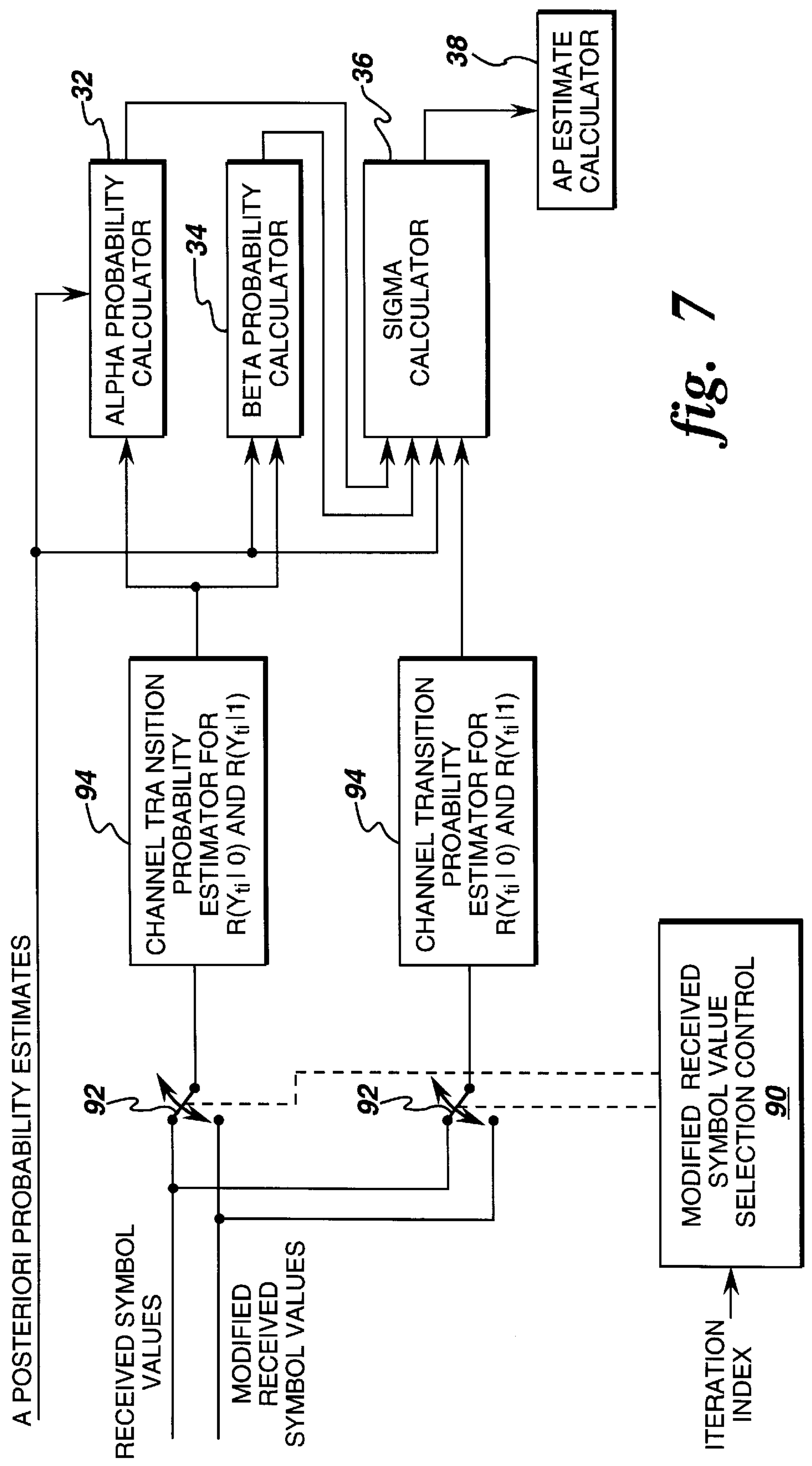
FIG. 7 is a block diagram of the bit probability estimator of FIG. 6.

FIG. 7 illustrates the bit probability estimator 80 of FIG. 6 in more detail. Switches 92 are controlled by a modified received symbol selection control 90 to select either the received symbol values or modified received symbol values as inputs to channel transition probability estimators 94 for use in the alpha, beta and sigma calculators, 32, 34, and 36, respectively. Similar to the embodiment of FIG. 3, the selection of received symbol values or modified received symbol values for the alpha and beta calculations is independent of the selection of values for the sigma calculations.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for decoding turbo code words, comprising:

iteratively calculating forward and backward state probabilities and a posteriori state transition probabilities for component code words of turbo code words according to a MAP decoding process;

for each received symbol output by a channel in response to the component code words, selecting either channel transition probability estimates or a modified channel transition probability estimates for calculating the forward and backward state probabilities and the a posteriori state transition probabilities, the selecting step for calculating forward and backward state probabilities being independent of the selecting step for calculating a posteriori state transition probabilities.

2. The method of claim 1, further comprising the step of utilizing an iteration index and providing modified channel transition probability estimates as a function of the iteration index.

3. The method of claim 1 wherein the modified channel transition probability estimates are calculated from modified received symbol values as follows:

$$\text{modified received symbol value} = \frac{\text{received symbol value} \times N + K \times 0.5}{N+K},$$

where N is the current iteration index and K is a constant.

4. The method of claim 1 wherein the modified channel transition probability estimates are calculated from modified received symbol values as follows:

$$\text{modified received symbol value} = \frac{\text{received symbol value} \times N}{N+K},$$

where N is the current iteration index and K is a constant.

5. The method of claim 1 wherein the modified channel transition probability estimates are calculated using a modified soft limiter function.

6. The method of claim 5 wherein the parameters of the modified soft limiter function are a function of a decoding iteration index.

7. The method of claim 1 wherein the MAP decoding process comprises a logarithmic MAP decoding process.

8. The method of claim 1 wherein the component code words comprise systematic bits and parity bits, the selecting step comprising selecting the channel transition probability estimates for the received symbols for calculating the forward state and backward state probabilities, the selecting step further comprising selecting either a channel transition probability estimate or a modified channel transition probability estimate for received symbols corresponding to the systematic bits and selecting the channel transition probability estimates for received symbols corresponding to the parity bits for calculating the a posteriori state transition probabilities.

9. A decoder for decoding turbo code words, comprising:

component decoders for iteratively calculating forward and backward state probabilities and a posteriori state transition probabilities for sequences of received symbols output by a channel in response to component code words of turbo code words according to a MAP decoding process;

a selection control which, for each received symbol in the component code words, selects either channel transition probability estimates or modified channel transition probability estimates for forward and backward state probability calculations and a posteriori state transition probability calculations, the selection control making independent selections for the forward and backward state probability calculations and the a posteriori state transition probability calculations.

10. The decoder of claim 9, wherein the component decoders utilize an iteration index and provide modified channel transition probability estimates as a function of the iteration index.

11. The decoder of claim 9 wherein the component decoders calculate the modified channel transition probability estimates from modified received symbol values as follows:

$$\text{modified received symbol value} = \frac{\text{received symbol value} \times N + K \times 0.5}{N + K},$$

where N is the current iteration index and K is a constant.

12. The decoder of claim 9 wherein the component decoders calculate the modified channel transition probability estimates from modified received symbol values as follows:

$$\text{modified received symbol value} = \frac{\text{received symbol value} \times N}{N + K},$$

where N is the current iteration index and K is a constant.

13. The decoder of claim 9 wherein the component decoders comprise a soft limiter function for calculating the modified channel transition probability estimates.

14. The decoder of claim 13 wherein the parameters of the modified soft limiter function are a function of a decoding iteration index.

15. The decoder of claim 9 wherein the MAP decoding process comprises a logarithmic MAP decoding process.

16. The decoder of claim 9 wherein the component code words comprise systematic bits and parity bits, the selection control selects the channel transition probability estimates for the received symbols for the forward state and backward state probability calculations, and the selection control selects either a channel transition probability estimate or a modified channel transition probability estimate for each received symbol corresponding to a systematic bit and a channel transition probability estimate for each received symbol corresponding to a parity bit for each a posteriori state transition probability.

* * * * *